United States Patent [19]

Russer

[11] 4,132,956

[45] Jan. 2, 1979

[54] CIRCUIT ARRANGEMENT FOR AMPLIFYING HIGH FREQUENCY ELECTROMAGNETIC WAVES

[75] Inventor: Peter Russer, Ulm, Fed. Rep. of Germany

[73] Assignee: Licentia Patent-Verwaltungs-G.m.b.H, Frankfurt am Main, Fed. Rep. of Germany

[21] Appl. No.: 891,145

[22] Filed: Mar. 28, 1978

[30] Foreign Application Priority Data

Mar. 29, 1977 [DE] Fed. Rep. of Germany ....... 2713820

[51] Int. Cl.$^2$ ............................................. H03F 7/06
[52] U.S. Cl. ......................................... 330/5; 330/4.6
[58] Field of Search ............................. 330/5, 4.5, 4.6

[56] References Cited

U.S. PATENT DOCUMENTS 3,723,755  3/1973  Morse .................. 330/4.5 X

Primary Examiner—Rudolph V. Rolinec
Assistant Examiner—Darwin R. Hostetter
Attorney, Agent, or Firm—Spencer & Kaye

[57] ABSTRACT

A circuit for amplifying high frequency electromagnetic waves composed of a Josephson junction constituting an electromagnetic high frequency line along which electromagnetic waves can propagate at a signal frequency and at least one idler frequency, the junction being supplied with a direct voltage which modulates its associated Josephson current with respect to time, and with a magnetic field which modulates that current with respect to space.

12 Claims, 13 Drawing Figures

DISPERSION LINE FOR THE ELECTROMAGNETIC WAVE

DISPERSION CURVE FOR THE LOWPASS LINE

DISPERSION CURVE FOR THE LOWPASS LINE

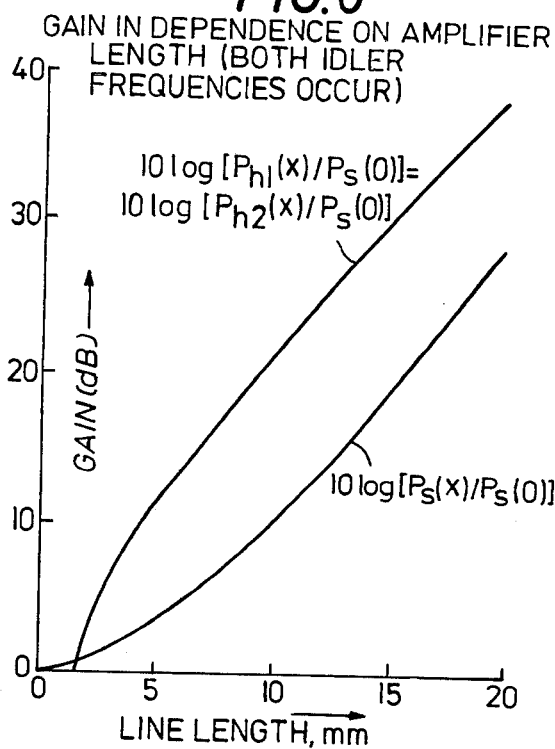
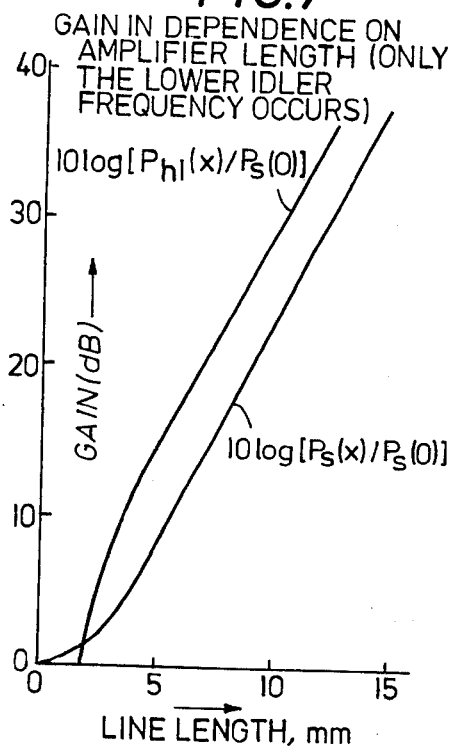
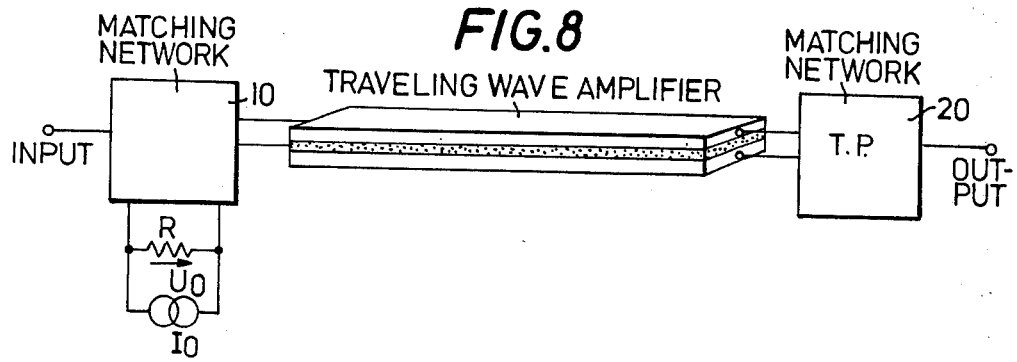
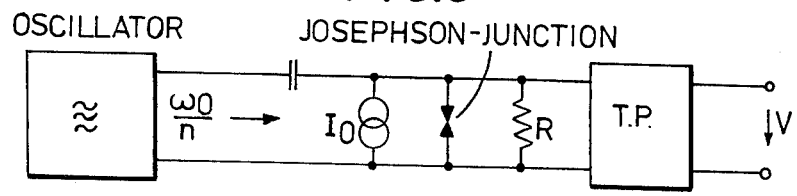

CIRCUIT ARRANGEMENT FOR AMPLIFYING HIGH FREQUENCY ELECTROMAGNETIC WAVES

BACKGROUND OF THE INVENTION

The present invention relates to a circuit arrangement for amplifying high frequency electromagnetic waves through the use of at least two weakly coupled superconductors arranged to form a Josephson junction which receives pumping energy from a direct voltage applied to the two superconductors.

A weakly coupled superconductor or Josephson junction is an arrangement of two superconductors which are separated by a thin tunnel layer of insulating material, or are connected together by a peak contact, an extremely narrow conductive bridge or in some other way.

SUMMARY OF THE INVENTION

It is an object of the present invention to provide a circuit arrangement of the above-mentioned type which permits low-noise, broadbanded and nonreactive amplification of high frequency electromagnetic waves in the range of about $10^9$ to $10^{12}$ Hz (1GH$_z$ to 1TH$_z$) and simultaneously permits application of the pumping energy required for its operation as a parametric amplifier in the form of a direct current.

These and other objects are achieved according to the invention in a circuit for amplifying high frequency electromagnetic waves and including means defining a Josephson junction composed of two weakly coupled superconductor bodies and constituting an electromagnetic high frequency line along which electromagnetic waves can propagate at a signal frequency and at least one idler frequency by the provision of means connected for applying a direct voltage between the bodies for supplying pumping energy thereto, and means disposed for establishing a transversal magnetic field between the bodies, whereby the Josephson current between the bodies is modulated with respect to time by the direct voltage and with respect to space by the magnetic field to cause the Josephson current to present a phase wave which meets the frequency and wave number conditions for amplification of at least one such high frequency electromagnetic wave.

Parametric amplifiers employing weakly coupled superconductors and receiving their pumping energy from a direct current are known per se. The configuration of the superconductors in the form of a concentrated Josephson junction, however, leads to a relatively narrowbanded amplifier which, in addition, does not have the desired nonreactive characteristic.

Parametric amplifiers are based on the use of switching elements which are nonlinear or are periodically variable with time. Unless variable time switching elements are used right from the start, the time variation is achieved by impressing a strongly periodic pump signal on a nonlinear switching element. Such nonlinear switching element is generally a nonlinear reactance which should have as little losses as possible.

A nonlinear lossless reactance is, for example, a nonlinear capacitor in which the voltage is a unique function of the time integral of the current or a nonlinear inductance in which the current is a unique function of the time integral of the voltage.

The Josephson current I(t) flowing through a Josephson junction is defined by $$I(t) = I_{max} \sin \Phi(t) \quad (1)$$

Where $\Phi(t)$ is called the quantum phase difference.

The quantum phase difference $\Phi(t)$ is defined in Solymar "Superconductive tunnelling and applications" Capman and Hall, London 1972 chapter 9 page 145 and following pages.

The value of the maximum current $I_{max}$ depends on the characteristics of the Josephson junction and on the temperature.

If a voltage V(t) is applied across a Josephson junction, the following relationship applies:

$$d\Phi(t)/dt = 2eV(t)/\hbar \quad (2)$$

where e is the electron charge and $\hbar$ is Planck's quantum of angular momentum.

In equations (1) and (2) the vectors representing V and I have the same direction. If a direct voltage $V_o$ is applied, a sinusoidal alternating current flows which has the angular, or radian, frequency.

$$\omega_o = 2|e|V_o/\hbar \quad (3)$$

and the amplitude $I_{max}$. The generated frequency is 483.6 GHz per mV of applied voltage.

It follows from equations (1) and (2) that the current through a Josephson junction is a unique function of the time integral of the applied voltage. Since a Josephson junction is not only a nonlinear lossless inductance, but also produces an alternating current when a direct voltage is applied, Josephson junctions can be used to produce parametric amplifiers in which the pump energy is supplied by an applied direct voltage.

Josephson junctions have power relationships which also include a term for the direct current power $P_o$ flowing into the Josephson junction. If a Josephson junction is embedded into a network in such a way that it is possible to exchange power at angular frequencies $\omega_1$ and $\omega_2$ and any desired mixed multiples $m\omega_1 + n\omega_2$, where m and n are integers, and if, additionally, a direct voltage $V_o$ is applied to the Josephson junction and the angular frequency $\omega_o$ which corresponds to the direct voltage $V_o$ according to equation (3) is likewise a combination of frequencies $\omega_1$ and $\omega_2$, the following relationships apply $$\sum_{m=1}^{+\infty} \sum_{n=-\infty}^{+\infty} \frac{mP_{mn}}{m\omega_1 + n\omega_2} = \frac{-sP_o}{s\omega_1 + t\omega_2} \quad (4)$$

$$\sum_{m=-\infty}^{+\infty} \sum_{n=1}^{+\infty} \frac{nP_{mn}}{m\omega_1 + n\omega_2} = \frac{tP_o}{s\omega_1 + t\omega_2} \quad (5)$$

where s and t are integers and $$\omega_o = s\omega_1 + t\omega_2 \quad (6)$$

Equations (4) and (5) hold if $\omega_o$ coincides with a mixing product of $\omega_1$ and $\omega_2$. Therefore equation (6) must be valid, where s and t are arbitrary integers.*

*See P. Russer "General Energy Relations for Josephson Junctions" Proceedings of the IEEE, Vol. 59, No. 2, February, 1971 pp. 282-283.

The direct current power $P_o$ is thus treated exactly like an effective a.c. power at the frequency $\omega_o$. That is what makes possible the construction of d.c. pumped parametric amplifiers, where $\omega_o$ is the pump frequency. Since superconductors retain a series of significant characteristics up to very high frequencies, it is possible to use Josephson junctions up to very high frequencies as well.

The present invention employs a stripline-shaped Josephson junction in which an applied voltage produces a time variation of Φ and a transversal magnetic field produces a space variation of Φ. By superposing the two effects, a pump wave is produced. Signal and idler waves are electromagnetic waves which are coupled through the pump wave. The traveling wave amplifier has a very simple structure and has the advantages characteristic for parametric traveling wave amplifiers, i.e. broadband operation and freedom from reactive effects.

BRIEF DESCRIPTION OF THE DRAWINGS

FIGS. 2-7 show curves used in explaining the operation of devices according to the present invention.

FIG. 8 is a block diagram of one preferred embodiment of the invention.

FIG. 9 is a block circuit diagram of an embodiment of a circuit unit employed in the device of FIG. 8.

DESCRIPTION OF THE PREFERRED EMBODIMENTS

Figure 1:
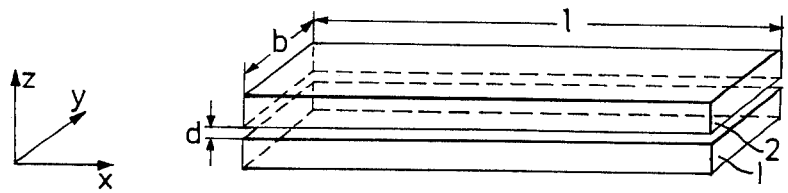
FIG. 1 is a perspective view illustrating the geometry of a planar Josephson junction employed in embodiments of the invention.

FIG. 1 shows the geometric arrangement of a planar Josephson junction. The Josephson junction includes two superconductors 1 and 2 each having a width b and a length l and separated by a thin insulating layer of a thickness of several multiples of 10 Å (1 Å = $10^{-8}$ cm). The Josephson junction can be produced, for example, by oxidizing a thin film layer 1, the oxide constituting the insulating layer, and then vapor-depositing or sputtering on the oxide a layer forming superconductor 2.

The value of the quantum phase difference Φ (x, t) of the stripline-shaped Josephson junction with respect to both time and space is defined by the known phase wave equation $$\delta^2\Phi/\delta x^2 \pm (1/c^2)(\delta^2\Phi/\delta t^2) = (1/\lambda_J^2) \sin \Phi + \beta_1(\delta\Phi/\delta t) + \beta_2 (\delta/\delta t) (\sin \Phi) \quad (7)$$

where c is the speed of propagation of the electromagnetic line wave (typically 1/30 of the speed of light in a vacuum), $\lambda_J$ is the Josephson penetration depth (typically several multiples of 10 microns) and $\beta_1$ and $\beta_2$ are loss components which will be neglected hereinafter.

If a direct voltage component $V_o$ is applied across the Josephson junction, the phase changes in dependence on the angular velocity $\omega_o$, according to equation (3). If additionally a transversal magnetic field $B_o$, which is homogeneous and constant, is applied between superconductors 1 and 2, the phase changes with respect to space in the x direction together with the wave vector.

$$k_o' = 2|e|B_o d_m/h_p \quad (8)$$

where $d_m$ is the sum of the thickness of the tunnel, or insulating layer between layers 1 and 2 and the magnetic penetration depth in the two superconductor layers 1 and 2.

The definition of the wave number $k_o$ of the quantum phase difference coincides with the ordinary use of the term wave number in physics ($2\pi/\lambda_o$) equals $2\pi$ times the number of wave periods per unit of length).

The current density $J_{max} \sin \Phi$ (x, t) where $J_{max}$ is the maximum Josephson current density per unit area of the stripline shaped Josephson junction, now varies with respect to time and space in a sinusoidal manner and a wave movement is produced which goes in the positive x direction. The phase velocity of this wave movement is given by $\omega_o/k_o'$ and need not be identical with the phase velocity of an electromagnetic wave which propagates in the line at the frequency $\omega_o$. The Josephson current phase wave (JPW) does not transport any energy in the x direction. Only when the phase velocity of the JPW is identical with the phase velocity of the electromagnetic wave that can propagate in the line at frequency $\omega_o$ will power be coupled from the JPW to the electromagnetic wave. If $k_o$ is the wave number of the wave at frequency $\omega_o$, the condition for the coupling of power from the JPW into the electromagnetic wave is $k_o = k_o'$.

Since the JPW also modulates the nonlinear inductance coating of the Josephson junction with respect to space and time, the following mixing products are also produced when a signal at angular frequency $\omega_s < \omega_o$ is coupled in:

$$\omega_{h1} = \omega_o - \omega_s \quad (9)$$

$$\omega_{h2} = \omega_o + \omega_s \quad (10)$$

where $\omega_{h1}$ and $\omega_{h2}$ are the radian frequencies of two idler waves.

The wave numbers of electromagnetic idler waves at the angular frequencies $\omega_{h1}$ and $\omega_{h2}$ are assumed to be $k_{h1}$ and $k_{h2}$.

If the conditions $$k_{h1} = k_o' - k_s \quad (11)$$

$$k_{h2} = k_o' + k_s \quad (12)$$

are met, the mixing products produced along the line at $\omega_{h1}$ and $\omega_{h2}$ can excite the electromagnetic waves in the Josephson current at these frequencies.

Figure 2:
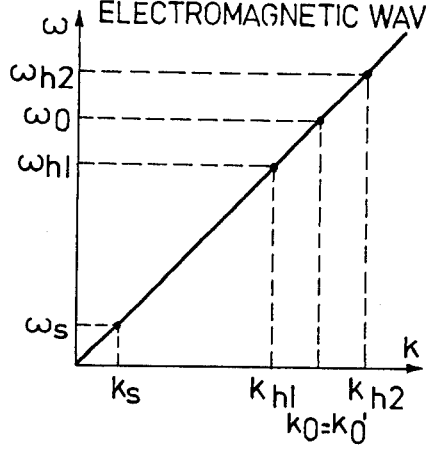

Various possible cases will now be discussed with the aid of Brillouin diagrams. FIG. 2 is a Brillouin diagram for the case without dispersion which is characterized by the linear relationship $\omega = k \cdot c$. The parameters $\omega_o$ and $k_o'$ which are determined by $U_o$ and $B_o$ lie on the dispersion line of the electromagnetic waves. A direct power conversion of the d.c. power fed to the Josephson junction by voltage $V_o$ into the electromagnetic wave at $\omega_o$ is possible as well as a power conversion to $\omega_{h1}$ and $\omega_{h2}$, if an input signal at the angular frequency $\omega_s$ is coupled in at the left-hand end of the line.

Coupling of power into an electromagnetic wave at frequency $\omega_o$ is undesirable and can be avoided in a simple manner in lines with nonlinear dispersion. And it is not always desirable to excite electromagnetic waves at frequency $\omega_{h1}$ as well as at frequency $\omega_{h2}$, but rather the excitation should be limited to one sideband at frequency $\omega_{h1}$ or $\omega_{h2}$.

Figure 3:
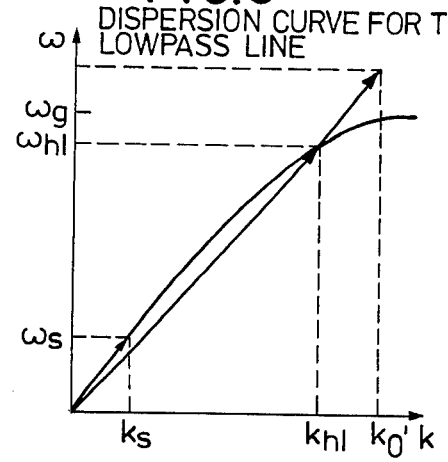
Figure 4:
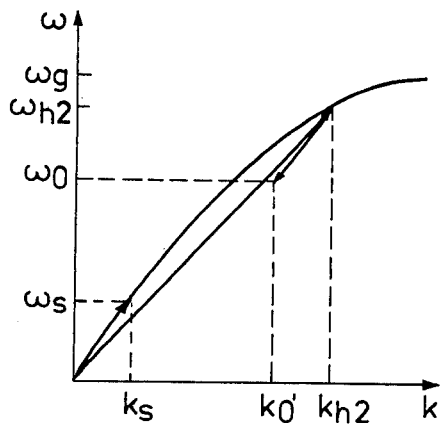

FIG. 3 shows a Brillouin diagram of a line with low-pass characteristics in which $\omega_o$ and $k_o'$ have been selected so that no excitation of waves is possible at $\omega_{h2}$ and $\omega_o$. Except with the angular signal frequency $\omega_s$, an electromagnetic wave will appear only at the lower idler angular frequency $\omega_{h1}$. By selecting a different combination of $\omega_o$ and $k_o'$, it is accomplished, as shown in FIG. 4, that only the upper one, $\omega_{h2}$, of the two idler frequencies can propagate. A particular advantage of the parametric traveling wave amplifier employing a Josephson junction is the simple and independent matching capability of $\omega_o$ and $k_o'$ by selection of the direct voltage $V_o$ and the constant external magnetic field $B_o$.

Figure 5:
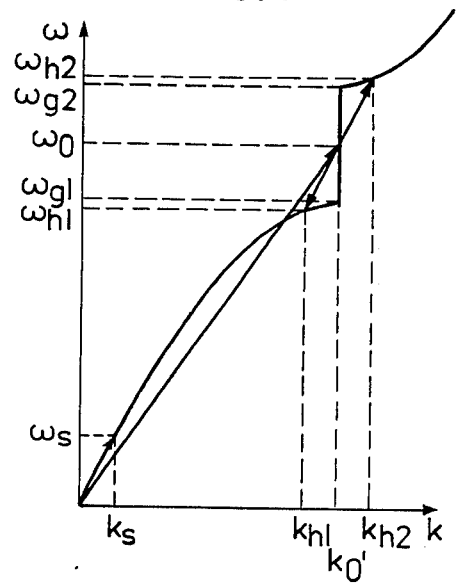

FIG. 5 shows another example for the case where electromagnetic waves are excited at the two idler frequencies $\omega_{h1}$ and $\omega_{h2}$ but not at the pump frequency $\omega_o$. This is accomplished in this particular case in that the line is provided with a blocking region between frequencies $\omega_{g1}$ and $\omega_{g2}$. Advisably $\omega_o$ and $k_o'$ can be selected in this line so that the wave number condition for excitation of the electromagnetic wave is met only for one of the two idler frequencies.

In order to produce the dispersion curves of FIGS. 3 to 5, the Josephson junction according to FIG. 1 must have a structure of the type usually employed for striplines with lowpass characteristics or with a blocking region. The phase wave equation (7) which has been derived from a homogeneous line is used for the calculations set forth below. The frequency selection obtained by nonlinear dispersion diagrams is considered by setting up a $\Phi(x, t)$ calculation in which only the possible frequencies, based on the Brillouin diagram, are encountered.

With the aid of interference calculation, the signal power $P_s(x)$ flowing in the x direction and the idler powers $P_{h1}(x)$, $P_{h2}(x)$ for the linear range of the amplifier with the two idler frequencies are expressed by:

$$P_s(x) = (b/\mu_o d_m)(\hbar_x/2e)^2 k_s \omega_s |A|^2 (\cosh 2\chi x + 1) \quad (13)$$

$$P_{h1}(x) = (b/\mu_o d_m)(\hbar_x/2e)^2 \tfrac{1}{2} k_{h2} \omega_{h1} |A|^2 (\cosh 2\chi x - 1) \quad (14)$$

$$P_{h2}(x) = (b/\mu_o d_m)(\hbar_x/2e)^2 \tfrac{1}{2} k_{h1} \omega_{h2} |A|^2 (\cosh 2\chi x - 1) \quad (15)$$

In this connection it has been assumed that the signal power $P_s(x)$ is coupled in at $x = 0$. From the marginal conditions applicable for the input end of the amplifier, it follows that $P_{h1}(o) - P_{h2}(o) = 0$. $\mu_o$ is the permeability of the vacuum, b is the line width (typically several microns), $d_m$ is the sum of the tunnel layer thickness and the magnetic penetration depth of the two superconductors forming the Josephson junction, and $|A|^2$ is a constant factor determined by $P_s(o)$. The amplification factor $\chi$ is given by $$\chi = 1/2\lambda_J^2 \sqrt{2 k_{h1} k_{h2}} \quad (16)$$

If $\omega_s = 2\pi \cdot 10^{11}$ rad/s, $\omega_{h1} = 8\pi \cdot 10^{11}$ rad/s and $\omega_{h2} = 1.2\pi \cdot 10^{12}$ rad/s, and with $c = 10^7$ m/s and $\lambda_J = 76.3\mu$, an amplification factor $\chi = 1.97 \cdot 10^2$/m results.*
FIG. 6 shows the gain of an amplifier in dependence on the line length. With a line 1 cm long, a gain of 11.28 dB can be obtained for a signal at frequency $\omega_s$.

*The Josephson penetration depths $\lambda_s = 76.3 \mu m$ and the speed c of the electromagnetic line wave have been calculated from $d = 10^{-9}$m $d_m = 3 \times 10^{-8}$m the relative dielectric constant $\epsilon_r = 10$ of the tunnelling layer, and a typical maximum Josephson current density $J_{max} = 0.5 \times 10^6$ Am$^{-2}$.

If the Josephson junction is designed so that the Brillouin diagram of the amplifier such that electromagnetic waves can be excited only at the angular frequencies $\omega_s$ and $\omega_{h1}$ the effective powers flowing in the x direction at these angular frequencies are $$P_s(x) = (b/\mu_o d_m)(\hbar_x/2e)^2 k_s \omega_s |\tilde{A}|^2 (\cosh 2\tilde{\chi} x + 1) \quad (17)$$

$$P_{h1}(x) = (b/\mu_o d_m)(\hbar_x/2e)^2 k_s \omega_{h1} |\tilde{A}|^2 (\cosh 2\tilde{\chi} x - 1) \quad (18)$$

with an amplification factor $$\tilde{\chi} = 1/4\lambda_J^2 \sqrt{k_{h1} k_s} \quad (19)$$

With the above assumptions $\tilde{\chi} = 3.42 \cdot 10^2$/m. FIG. 7 shows the gain for the signals at the frequencies $\omega_3$ and $\omega_{h1}$.

FIG. 8 shows a particularly advantageous embodiment of a circuit arrangement according to the invention for amplifying high frequency electromagnetic waves. This circuit includes a matching network 10 which serves the purpose of matching an input signal at the angular frequency $\omega_s$ to the input impedance of the traveling wave amplifier and which provides, by means of a constant current source providing a current $I_o$ and a resistor R, the direct voltage $V_o$ to the traveling wave amplifier. The traveling wave amplifier is designed as shown in FIG. 1. A matching network 20 terminates the traveling wave amplifier for signals at the signal and idler frequency or frequencies, without reflection. Moreover, the output power at the signal frequency or one of the idler frequencies is transformed to the characteristic impedance of the line to be connected at the output and is there coupled out. It is of advantage if the matching networks also employ superconductive structures since high quality factor (Q) networks can be realized with superconductors in the microwave range. In order to obtain the low, extremely well stablized direct voltage $V_o$, it is advisable to impress a well stabilized direct current $I_o$ onto a resistor R having a low resistance. R should be selected to have a sufficiently low resistance, and to be cooled, so that the thermal noise of R does not produce broadening of the spectral lines of $\omega_o$.

The length of the Josephson junction is in the order of one centimeter, its width of the order of several $10^{-6}$m, the insulating layer is in the order of several $10^{-9}$m. The magnetic field vector has y-direction according to FIG. 1.

As matching networks in FIG. 8 can be used:
(a) Non-uniform transmission lines (described in R. N. Ghose "Microwave Circuit theory and analyses" McGraw Hill 1963. Impedance transformation via non-uniform transmission lines chapter 12 page 340 and following pages).
(b) Strip lines with a length equal to quarter wavelength and wave impedance equal to the square root of the product of travelling wave amplifier input/output impedance and input/output line wave impedance (described in R. N. Ghose "Microwave Circuit theory and analyses" McGraw Hill 1963. Impedance transformation via $\lambda/4$ lines chapter 5 page 83 and following pages).
(c) Impedance matching can also be performed via microwave resonators (described in R. N. Ghose "Microwave Circuit theory and analyses" McGraw Hill 1963. Impedance transformation via resonators section 8.4 page 187 and following pages).

(d) Special means for impedance matching are discribed in the following publication IEEE Trans. Magnetics MAG 13 No. 1 January 1977, page 392–395 Finnegan-Holdemann-Wahlster "Microwave phenomens in thinfilm Josephson junctions coupled to a contiguous microstrip resonator." Since input and output of the travelling wave amplifier must be matched at different frequencies, the matching network must be either of broadband type (for example nonuniform transmission line) or in the case of narrow band type (resonator or line transformer) must be used in connection with frequency dividing networks. A further method consists in using one resonator with resonant frequencies at the idler and signal frequencies or one transformation line with length $L=(2n_i+1)\,\lambda_i/4$ ($\lambda_i$=wavelength of signal or idler) where the above condition is fulfilled for different frequencies $\omega$; (signal, idler) by different integers $n_i$. All these described methods are state of the art.

A supply voltage circuit arrangement which permits an even better stabilization of $V_o$ is shown in FIG. 9. A Josephson junction 92 is connected in parallel with resistor R. The direct current sources impresses a current $I_o$ on R and the Josephson junction 92 so that a direct voltage component $V_o$ appears across R. An external oscillator couples in a current at the frequency $\omega_o/n$. In order to stabilize $V_o$, the stepped structure of the direct current characteristic of Josephson junctions in the presence of microwave irradiation is now utilized. By applying to the junction a microwave signal at the angular frequency $\omega_o/n$, regions appear in the current-voltage characteristic at $V_o/n$ and at the whole number multiples of this voltage in which the d.c. component of the voltage applied across the Josephson junction remains constant. In the region of these steps, a d.c. component is stabilized due to the voltage-frequency relationship existing in Josephson junctions and the accuracy and fluctuations of $V_o$ depend only on the accuracy and the fluctuations of the frequency of the applied microwave signal. The lowpass filter T.P. serves only to block out the microwave components. In the circuit according to FIG. 9, the Josephson junction 92, resistor R and lowpass filter T.P. are cooled.

Any pair of superconducting dc supply leads acts as excellent low pass and exhibits high microwave attenuation. This attenuation is enhanced if a capacitor is connected in parallel with the dc supply leads. As Josephson junction in FIG. 9 any tunnel junction or other weak link (Solymar "Superconductive tunnelling and applications" Chapman and Hall, London 1972) can be used. No special structure is necessary.

Since the current-voltage characteristic of Josephson junctions may contain stages of a very high order (n = 10 ... 100 are possible) the frequency of the signal irradiated to stabilize $V_o$ may lie below the pump frequency by a corresponding factor. The design of traveling wave amplifiers employing planar Josephson junctions and pumped by microwaves would of course also be possible. In this case, however, the pump power would have to be irradiated at a frequency $\omega_o$.

The above described direct voltage pumped traveling wave amplifier is superior to the microwave pumped traveling wave amplifier in the following two respects, even if external microwave signals are used to stabilize the pump frequency. Firstly, with a direct voltage pump traveling wave amplifier the irradiation can be effected at a much lower frequency. Secondly, in the direct voltage pumped traveling wave amplifier the JPW is used as the pumping wave in contradistinction to the electromagnetic wave in the microwave pumped traveling wave amplifier. The matchability of $k_o'$ at the JPW results in a significant simplification of the structure of the traveling wave amplifier.

A superconductive coil can be used to produce the magnetic field $B_o$. After the desired magnetic field has been set the coil is short-circuited via a cryotron. The magnetic field now remains unchanged and without fluctuations over any desired periods of time.

Figure 10:
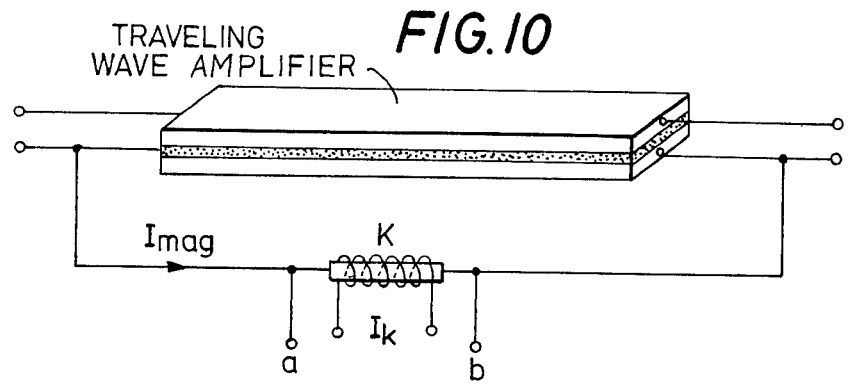
FIG. 10 is a circuit diagram of an embodiment of a portion of the circuits of FIGS. 8 and 9.

FIG. 10 shows an advantageous way of producing $B_o$ in the traveling wave amplifier itself by impression of a direct current. One of the two conductor layers of the traveling wave amplifier is connected to form a direct current feedback from the output to the input of the traveling wave amplifier. This feedback is interrupted by a cryotron K and is superconductive everywhere else. If the cryotron is made to be normally conductive by the impression of a control current $I_k$, a direct current $I_{mag}$ can be impressed on the traveling wave amplifier. After setting the current $I_{mag}$ to produce the desired magnetic field $B_o$ in the traveling wave amplifier, $I_k$ is switched off. $I_{mag}$ now flows through a closed superconductive loop from the output of the traveling wave amplifier back to the input. Terminals a and b can now be decoupled from the external direct current source.

Figure 11:
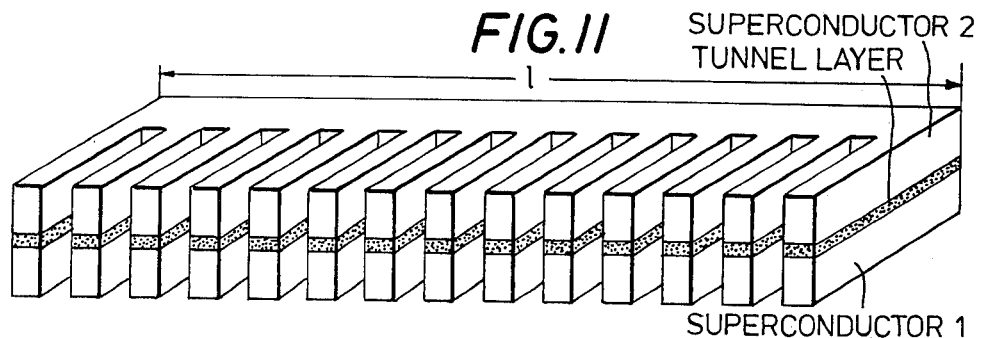
FIG. 11 is a perspective view of an embodiment of a Josephson junction which can be employed in circuits according to the invention.

In order to realize a certain dispersion curve for the electromagnetic waves, the planar Josephson junction can advisably be provided with a planar structure different from that shown in FIG. 1. FIG. 11 shows a traveling wave amplifier including two superconductive layers and having a spatially periodic surface structure. Otherwise the same dimensioning principles apply as shown in, and described with reference to, FIG. 1. Lines with spatially periodic structures have pass band regions and stop band regions for the electromagnetic waves. With a geometry as shown in FIG. 11 it is therefore possible to create the dispersion diagram shown in FIG. 5.

Figure 12:
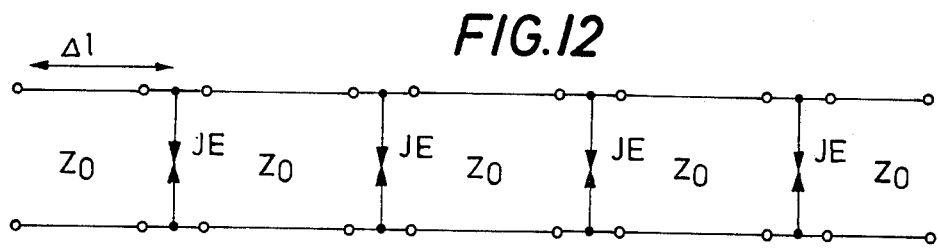
FIGS. 12 and 13 are diagrams of further embodiments of components of circuits according to the invention.
Figure 13:
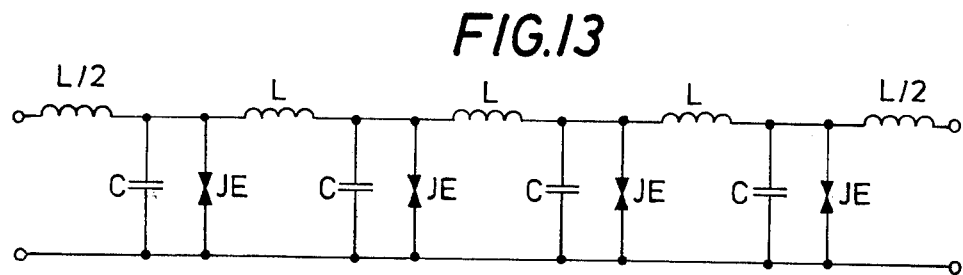

Finally, two further embodiments of the invention will be described briefly. Just as lines can be realized by a simulation with discrete components, this is also possible for traveling wave amplifiers. In FIG. 12, discrete, i.e. not planar, Josephson junctions JE are connected between short line elements each of a length $\Delta l$. The JPW is produced by biasing all Josephson junctions with $V_o$, the currents oscillate at $\omega_o$ and each loop, formed by a line element of a length $\Delta l$ and the two adjacent Josephson junctions, is penetrated by a certain magnetic flux $\phi_{mag}$. This produces a quantum phase difference $$\Delta\Phi = (2e/h_p)\,\phi_{mag} \qquad (20)$$

between adjacent Josephson junctions if the loop is entirely superconductive. FIG. 13 shows a circuit arrangement in which the line elements between the Josephson junctions are also discrete simulations each formed of a series inductor L and a shunt capacitor C. Such a discrete line simulation will create a dispersion diagram as shown in FIG. 3 or FIG. 4, respectively. The Josephson junction JE described in FIGS. 12 and 13 are of the well known tunnel junction or narrow bridge weak link (Dayem bridge) Type. These Josephson junctions are state of the art and described in the book of Solymar.

It will be understood that the above description of the present invention is susceptible to various modifications, changes and adaptions, and the same are intended to be comprehended within the meaning and range of equivalents of the appended claims.

What is claimed is:

1. A circuit for amplifying high frequency electromagnetic waves, comprising: means defining a Josephson junction composed of two weakly coupled superconductor bodies and constituting an electromagnetic high frequency line along which electromagnetic waves can propagate at a signal frequency and at least one idler frequency; means connected for applying a direct voltage between said bodies for supplying pumping energy thereto; and means disposed for establishing a transversal magnetic field between said bodies; whereby the Josephson current between said bodies is modulated with respect to time by the direct voltage and with respect to space by the magnetic field to cause the Josephson current to present a phase wave which meets the frequency and wave number conditions for amplification of at least one such high frequency electromagnetic wave.

2. An arrangment as defined in claim 1 further comprising a matching network connected to the input, and a matching network connected to the output, of said Josephson junction.

3. An arrangement as defined in claim 2 wherein each said matching network is formed of superconducting components.

4. An arrangement as defined in claim 3 wherein said means for applying a direct voltage comprise a resistor connected to the input of said Josephson junction; and a stabilized direct current source connected to supply a direct current to said resistor.

5. An arrangement as defined in claim 4 wherein said resistor is cooled in order to reduce thermal noise.

6. Circuit arrangement as defined in claim 5 wherein said means for applying a direct voltage additionally comprise a further Josephson junction connected in parallel with said resistor, and an oscillator connected to actuate said further Josephson junction by a signal at a frequency which is a whole number fraction of the pump frequency for said circuit.

7. An arrangement as defined in claim 1 wherein said bodies are stripline shaped superconductors and said Josephson junction includes an insulating layer disposed between said bodies.

8. An arrangement as defined in claim 7 wherein one of said stripline-shaped superconductors is made of a thin layer of a superconducting material, at least one surface of said thin layer is covered with a thin oxide layer constituting said insulating layer and the other one of said superconductors is constituted by a second superconducting layer deposited on said oxide layer by vapor-depositing or sputtering a superconductive material.

9. An arrangement as defined in claim 7 wherein said stripline-shaped Josephson junction is provided with a spatially periodic structure.

10. An arrangement as defined in claim 9 wherein said Josephson junction is provided with recesses which extend parallel to one another and perpendicularly to the planes of said superconductors, starting from one longitudinal side of said junction, whereby said junction has a comb shape.

11. An arrangement as defined in claim 1 wherein, for the purpose of simulating an electromagnetic high frequency line, said Josephson junction comprises a plurality of discrete, nonplanar, Josephson junctions, and a plurality of short line elements each of a length $\Delta l$ and each connected between two adjacent junctions, with each loop formed by a line element and the two adjacent junctions being penetrated by a magnetic flux.

12. An arrangement as defined in claim 11 wherein said line elements disposed between said junctions are superconductors.

* * * * *